(12) United States Patent
Unno

(10) Patent No.: US 6,301,001 B1
(45) Date of Patent: Oct. 9, 2001

(54) OPTICAL ELEMENT MANUFACTURING SYSTEM, AN ILLUMINATION SYSTEM, AND AN EXPOSURE APPARATUS

(75) Inventor: Yasuyuki Unno, Tochigi-ken (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/518,103

(22) Filed: Mar. 3, 2000

Related U.S. Application Data

(62) Division of application No. 08/942,979, filed on Oct. 2, 1997, now Pat. No. 6,120,950.

(30) Foreign Application Priority Data

Oct. 3, 1996 (JP) .................................................. 8-281830

(51) Int. Cl.$^7$ .............................. G03B 27/54; G03C 5/00; G01B 11/00

(52) U.S. Cl. .............................. 355/67; 430/30; 430/321; 430/394; 356/399; 356/401

(58) Field of Search .............................. 355/67; 356/399, 356/401; 430/30, 321, 394, 22, 396; 359/565, 575

(56) References Cited

U.S. PATENT DOCUMENTS

| | | | |
|---|---|---|---|
| 4,440,493 | 4/1984 | Hiraga | 355/86 |
| 4,774,158 | 9/1988 | Vervoordeldonk et al. | 430/30 |
| 4,895,790 | 1/1990 | Swanson et al. | 430/321 |
| 5,156,943 | 10/1992 | Whitney | 430/321 |
| 5,161,059 | 11/1992 | Swanson et al. | 359/565 |
| 5,218,471 | 6/1993 | Swanson et al. | 359/565 |
| 5,503,959 | 4/1996 | Langston | 430/312 |
| 5,631,762 | 5/1997 | Kataoka | 359/204 |
| 5,663,016 | 9/1997 | Hong | 430/5 |
| 5,995,285 | 11/1999 | Unno | 359/565 |
| 6,120,950 | * 9/2000 | Unno | 430/30 |

FOREIGN PATENT DOCUMENTS 4-212730    8/1992  (JP) .

OTHER PUBLICATIONS

K. Ismail, "A Novel Method for Submicron Structurization Using Optical Projection Lithography," Microelectronic Engineering 1, pp. 295–300, 1983.

M.B. Stern, et al., "Fabricating Binary Optics: Process Variables Critical to Optical Efficiency," Journal of Vacuum Science and Technology: Part B, vol. 9, No. 6, Nov. 1, 1991, pp. 3117–3121.

T.J. Suleski, et al., "Gray–Scale Masks for Diffractive–Optics Fabrication: I. Commercial Slide Imagers," Applied Optics, vol. 34, No. 32, Nov. 10, 1995, pp. 7507–7517.

D.C. O'Shea, et al., "Gray–Scale Masks for Diffractive–Optics Fabrication: II. Spatially Filtered Halftone Screens," Applied Optics, vol. 34, No. 32, Nov. 10, 1995, pp. 7518–7526.

(List continued on next page.)

*Primary Examiner*—Russell Adams
*Assistant Examiner*—Rodney Fuller
(74) *Attorney, Agent, or Firm*—Fitzpatrick, Cella, Harper & Scinto

(57) ABSTRACT

An optical element manufacturing method includes a first process for forming a mask pattern on a substrate, and a second process for forming a step-like structure on the substrate by use of the mask pattern, wherein the first and second processes are repeated N times, and wherein, before execution of the (k)th time second process where $2 \leq k \leq N$, there is a process for determining a relative alignment error between a mask pattern as formed through the (k)th time first process and a mask pattern as formed through the (k–1)th time first process, and wherein the height of the step-like structure to be defined by the (k)th time second process is determined in accordance with the alignment error.

7 Claims, 15 Drawing Sheets

OTHER PUBLICATIONS

G.J. Swanson, "Binary Optics Technology: The Theory and Design of Multi–Level Diffractive Optical Elements," Massachusetts Institute of Technology Lincoln Laboratory, Technical Report 854, pp 1–47 (Aug. 1989).

G.J. Swanson, "Binary Optics Technology: Theoretical Limits on the Diffraction Efficiency of Multilevel Diffractive Optical Elements," Massachusetts Institute of Technology Lincoln Laboratory, Technical Report 914, pp 1–27 (Mar. 1991).

* cited by examiner

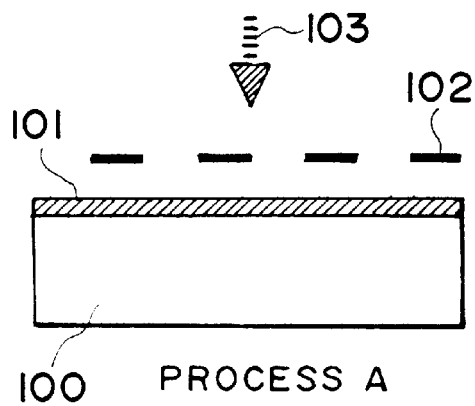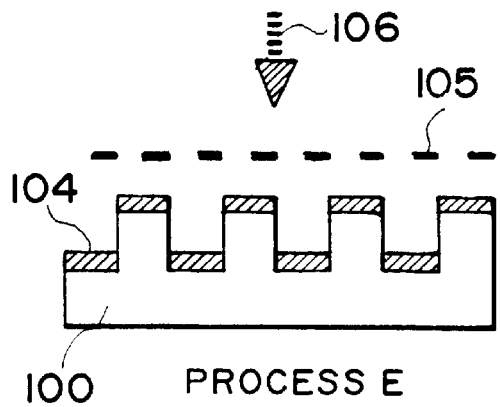
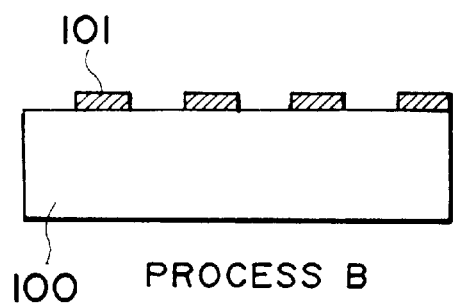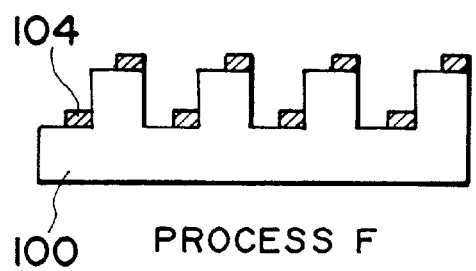
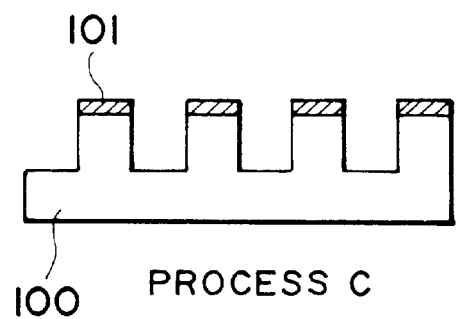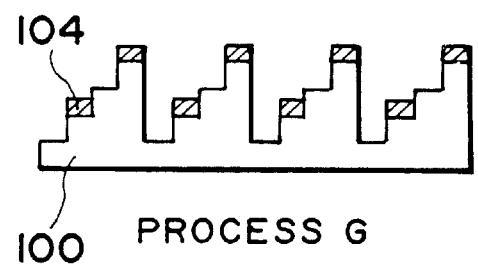
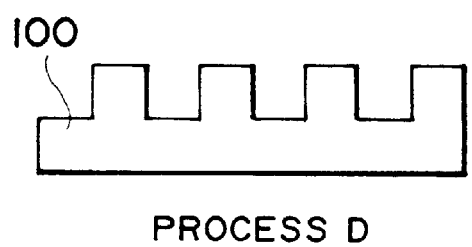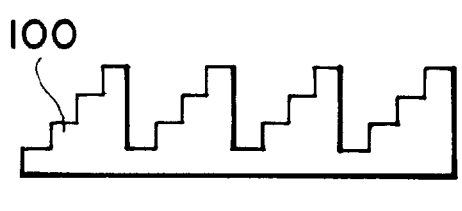
FIG. 5

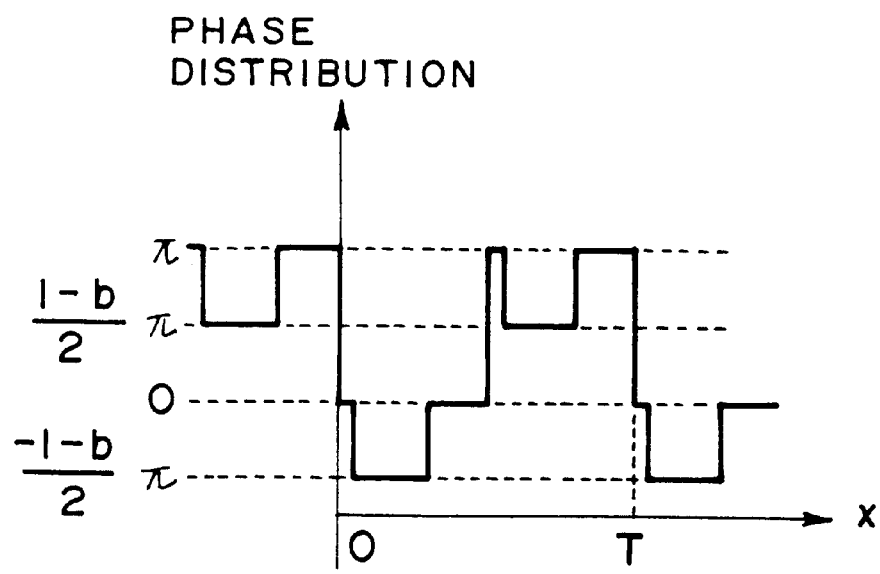
F I G. 6
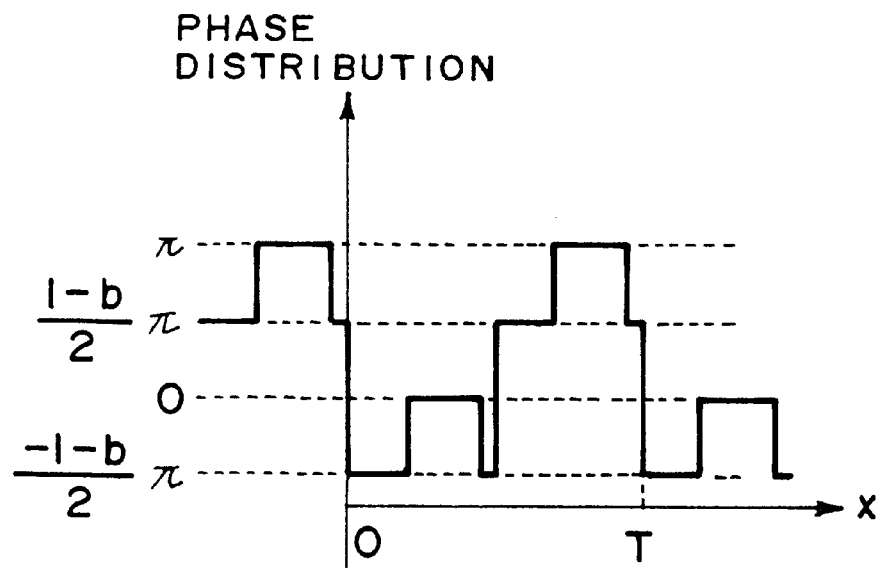
F I G. 7

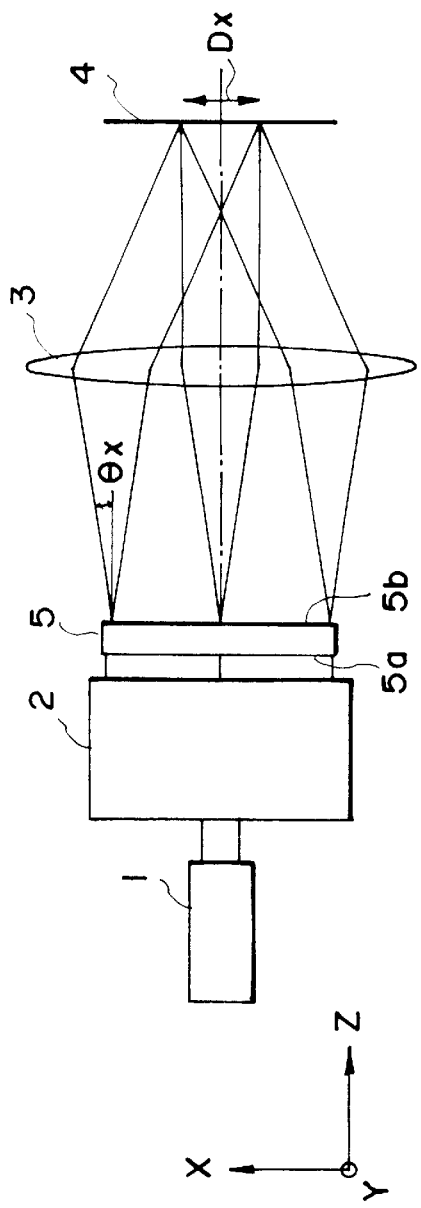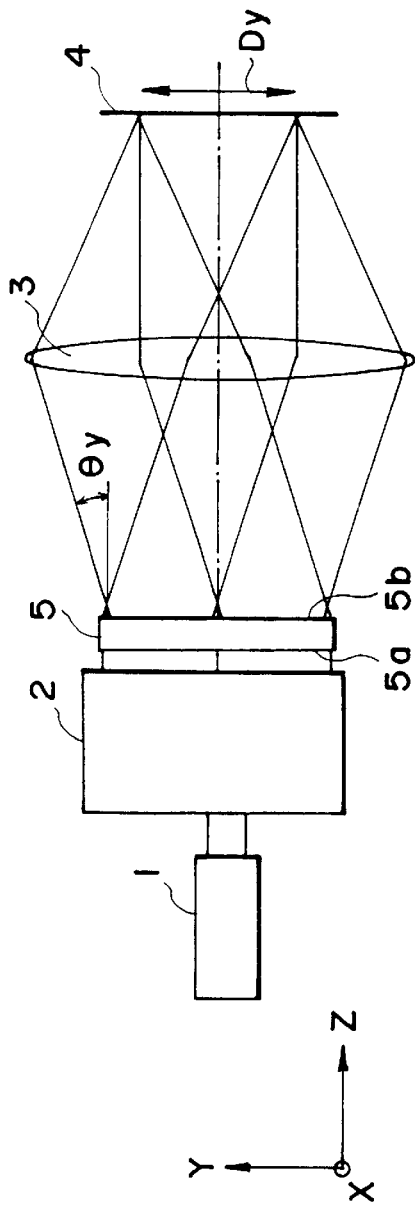

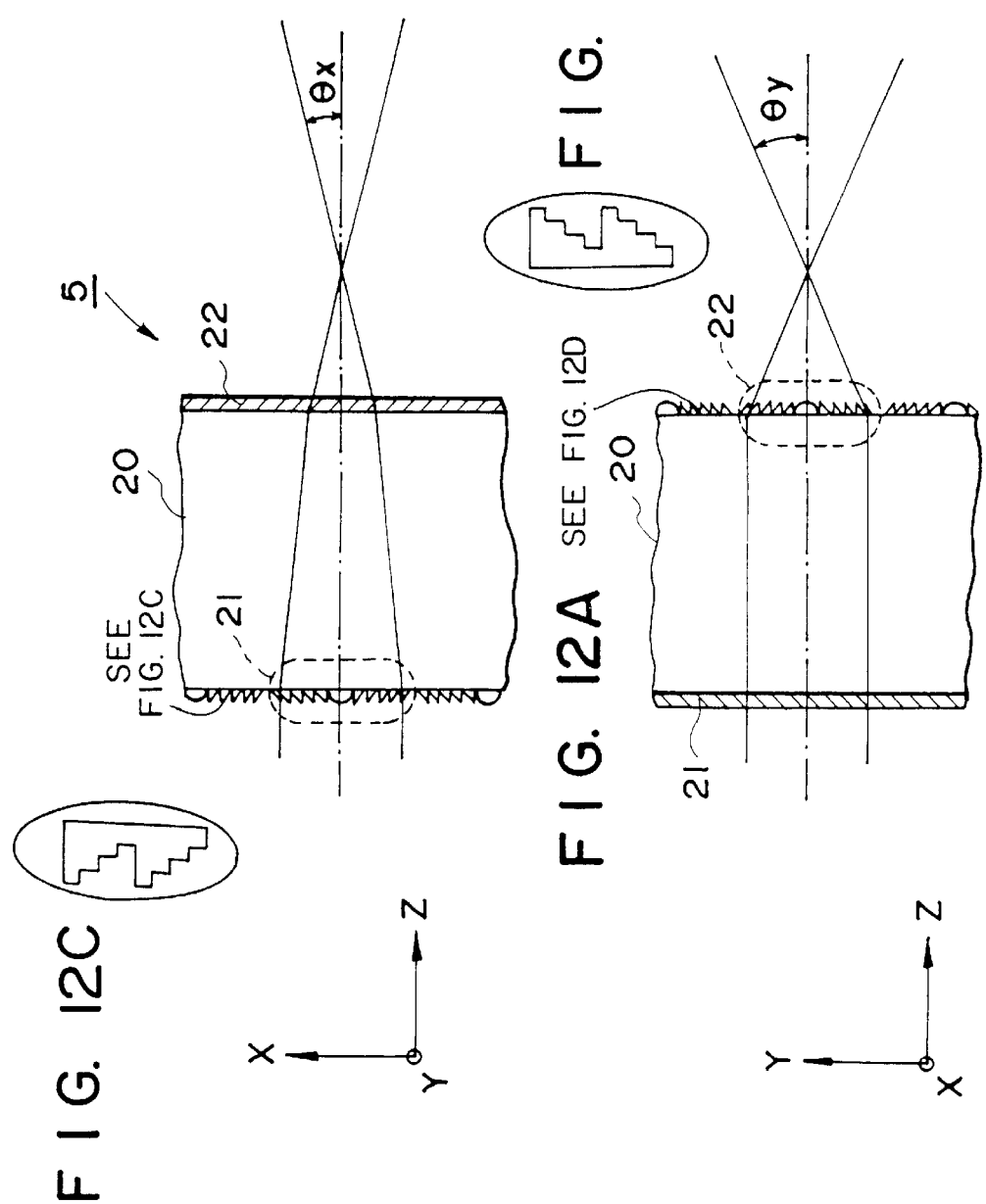

OPTICAL ELEMENT MANUFACTURING SYSTEM, AN ILLUMINATION SYSTEM, AND AN EXPOSURE APPARATUS

This application is a division of Application Ser. No. 08/942,979 filed Oct. 2, 1997 now U.S. Pat. No. 6,120,950.

FIELD OF THE INVENTION AND RELATED ART

This invention relates to an optical element manufacturing method and, more particularly, to a method of manufacturing a binary type diffractive optical element.

Many types of optical systems with a diffractive optical element using light diffraction phenomenon have been proposed. As examples of such diffractive optical elements, there are a Fresnel zone plate, a diffraction grating and a hologram.

Generally, for a diffraction type optical element having a blazed shape, the manufacture becomes more difficult with the decrease in pitch. As regards the shape of the diffractive optical element, if a shape of binary type is selected, semiconductor device manufacturing techniques can be applied to the manufacture of it, and a fine pitch can be accomplished relatively easily. For these reasons, research and developments have recently been made on binary type diffractive optical elements wherein the blazed shape is approximated by use of a step-like (with levels) shape.

For details of a binary type diffractive optical element, reference may be made to the following publications:

a) G. J. Swanson, "Binary Optics Technology: The Theory and Design of Multi-level Diffractive Optical Elements", Massachusetts Institute of Technology Lincoln Laboratory, Technical Report 854, Aug. 14, 1989.

b) G. J. Swanson, "Binary Optics Technology: Theoretical Limits on the Diffraction Efficiency of Multilevel Diffractive Optical Elements", Massachusetts Institute of Technology Lincoln Laboratory, Technical Report 914, Mar. 1, 1991.

Referring to FIG. 5 showing the manner of manufacturing an optical element according to the present invention, the manner of manufacturing a binary type diffractive optical element of four-level structure will be briefly explained.

Denoted in the drawing at 100 is a transparent glass plate of a refractivity n, and denoted at 101 is a resist. Denoted at 102 is a mask to be used for a first exposure. Denoted at 103 is exposure light. In this example, the resist 101 comprises a positive type resist.

First, in process A, a pattern of a mask 102 is transferred to the resist 101 by use of the exposure light 103. In process B, development of the resist 101 is performed. In process C, etching of the glass substrate 100 is performed while the resist 101 after being developed is used as a mask pattern. Then, in process D, unnecessary resist on the substrate 100 is removed, whereby a binary type optical element of two-level step structure is accomplished.

The etching depth $d_1$ in process C is determined, when the wavelength to be used with the binary type optical element is $\lambda$, by the following equation:

$$d_1 = \lambda/[2(n-1)]$$

Subsequently, to the glass substrate 100 on which a binary type optical element of two-level structure has been formed, a resist material (104) is applied again, and in process E a mask 105 is used to perform a second exposure. The pattern of the mask 105 has a pitch a half of the pattern of the mask 102. The exposure is performed while correctly aligning the edge of a light blocking portion of the mask 105 pattern with the edge of the two-level binary structure. By these procedures and after the development treatment at process F, a resist pattern as illustrated is formed.

Subsequently, in process G, second etching is performed by using the resist pattern formed in process F as a mask pattern. In process H, unnecessary resist is removed, whereby a binary type optical element of four-level structure is accomplished. Here, the etching depth $d_2$ in process G is determined by the following equation:

$$d_2 = \lambda/[4(n-1)]$$

While the foregoing description has been made in relation to a four-level structure, as is well known in the art, a binary type optical element of eight-level structure or sixteen-level structure can be manufactured by repeating the above-described procedure while changing the mask pitch.

In process E of the processes for manufacturing a binary type diffractive optical element described above, it is not easy to align the mask 105 for the second exposure with respect to the mask 102 of the first exposure. Usually, there occurs a registration error (alignment error) of some degree.

The effect of such alignment error will be described with reference to FIGS. 1A, 1B, 2A and 2B. Denoted in the drawings at 110 is a glass substrate on which a diffraction grating of two-level structure has been formed. Denoted at 111 is a mask for use in second exposure.

Here, one period of the two-level structure is T, and the mask 111 has a light blocking portion of a width T/4. Denoted at 112 is a coordinate axis for explanation, and the pattern formed on the glass substrate 110 has a periodicity in X-axis direction.

FIG. 1A shows a state in which the mask 111 is deviated from an idealistic position, in positive X-axis direction by aT/4 (a>0).

If processes E–H in FIG. 5 are performed in this state, then an accomplished diffractive optical element will have a shape such as shown in FIG. 1B.

FIG. 2A shows a state in which the mask 111 is deviated from an idealistic position, in negative X-axis direction by |aT/4| (a<0). If processes E–H in FIG. 5 are performed in this state, then an accomplished element will have a shape such as shown in FIG. 2B.

With these shapes, as a matter of course, there occurs a decrease of diffraction efficiency. When the diffraction efficiency of first-order diffraction light is calculated by using the value "a" as a parameter, it follows that:

$$|C_1|^2 = (8/\pi^2)\{1 - \sin[\pi(|a|/2)]\} \quad (1)$$

Equation (1) is derived in accordance with scalar theory, and details of it will be described later with reference to embodiments of the present invention. The result can be shown in a graph, such as that of FIG. 3. In the case where there is no alignment error, that is, when a=0, an idealistic diffraction efficiency of 81% is attainable with respect to the four-level structure. However, with enlargement of alignment error, the diffraction efficiency decreases considerably. Since the decrease of diffraction efficiency leads to various problems such as a decrease of usable light quantity or an increase of unnecessary diffraction light, causing flare or the like, it should be suppressed as much as possible.

SUMMARY OF THE INVENTION

It is an object of the present invention to provide an optical element manufacturing method in which an alignment error, if any, may cause small reduction of diffraction efficiency.

In accordance with an aspect of the present invention, there is provided an optical element manufacturing method, comprising: a first process for forming a mask pattern on a substrate; and a second process for forming a step-like structure on the substrate by use of the mask pattern; wherein the first and second processes are repeated N times, and wherein, before execution of the (k)th time second process where $2 \leq k \leq N$, there is a process for determining a relative alignment error between a mask pattern as formed through the (k)th time first process and a mask pattern as formed through the (k−1)th time first process; and wherein the height of the step-like structure to be defined by the (k)th time second process is determined in accordance with the alignment error.

In accordance with another aspect of the present invention, there is provided an optical element manufacturing method, comprising: a first process for forming a first mask pattern on a substrate; a second process for forming a step-like structure on the substrate by use of the first mask pattern; a third process for forming a second mask pattern on the substrate; a fourth process for determining a relative alignment error between the first and second mask patterns; and a fifth process for forming a step-like structure on the substrate by use of the second mask pattern, wherein the height of the step-like structure to be formed through the fifth process is determined in accordance with the alignment error.

In accordance with a further aspect of the present invention, there is provided an optical element manufacturing method, comprising: a first process for forming a mask pattern on a substrate; a second process for determining a relative alignment error between a mask pattern just having been formed and a mask pattern previously formed; and a third process for forming a step-like structure on the substrate by use of the mask pattern just having been formed, wherein the height of the step-like structure to be formed through the third process is determined in accordance with the alignment error.

The present invention can be applied to an optical element manufacturing system, or to an illumination system or exposure apparatus having an optical element manufactured in accordance with the optical element manufacturing method. Also, the invention can be applied to a device manufacturing method which uses such an exposure apparatus.

These and other objects, features and advantages of the present invention will become more apparent upon a consideration of the following description of the preferred embodiments of the present invention taken in conjunction with the accompanying drawings.

BRIEF DESCRIPTION OF THE DRAWINGS

FIG. 5 is a flow chart for explaining the procedure of manufacture of a binary type diffractive optical element of four-level structure, according to an embodiment of the present invention.

FIG. 6 is a schematic view for explaining the relation between alignment error and phase distribution of optical element.

FIG. 7 is a schematic view for explaining another example of the relation between alignment error and phase distribution of optical element.

FIGS. 11A and 11B are schematic views, respectively, of a main portion of an illumination system into which an optical element manufactured in accordance with an embodiment of the present invention is incorporated.

FIGS. 12A and 12C and FIGS. 12B and 12D are enlarged schematic views, of a diffractive optical element in the structure shown in FIGS. 11A and 11B, respectively.

DESCRIPTION OF THE PREFERRED EMBODIMENTS

Figure 4:
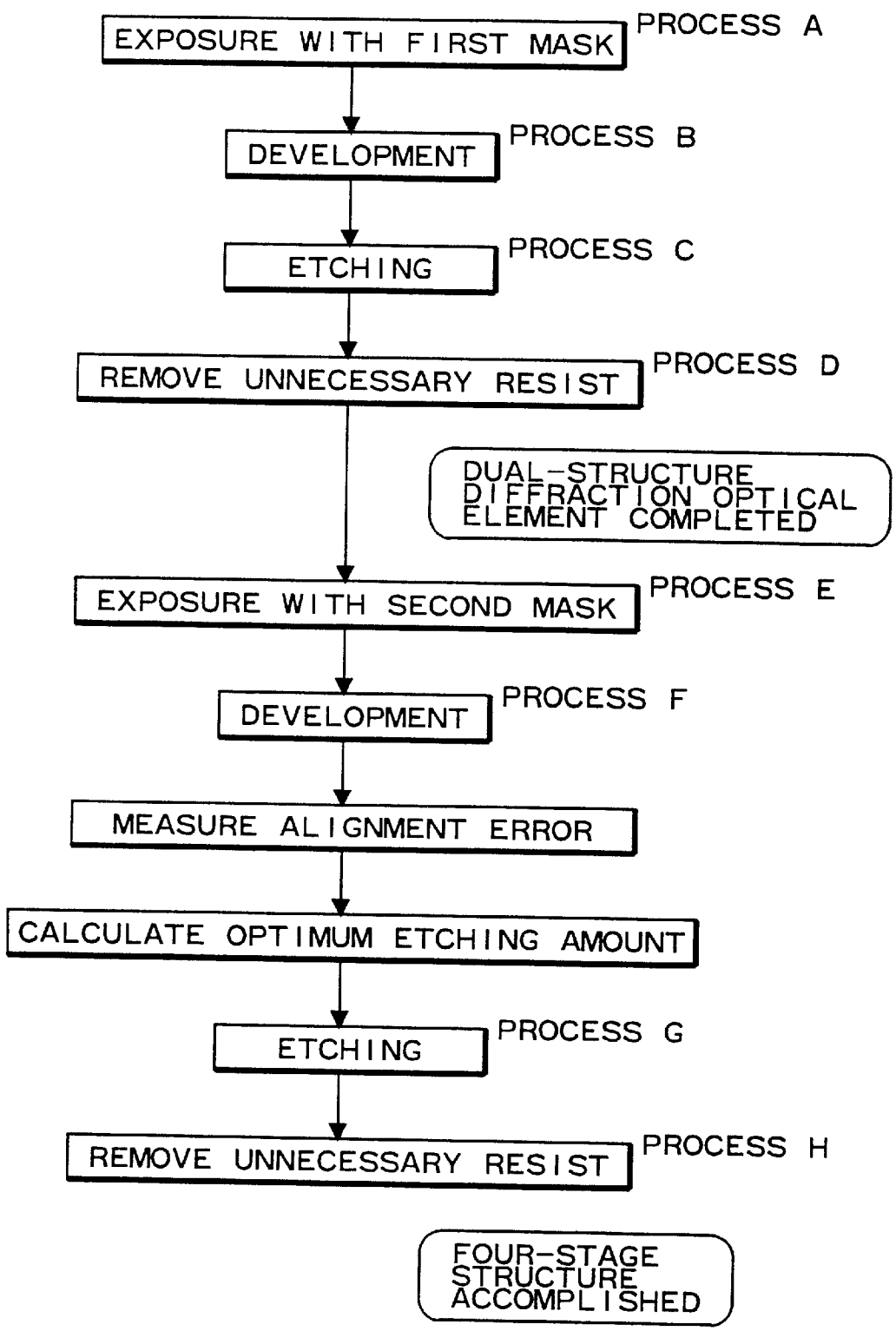
FIG. 4 is a flow chart for explaining the procedure of manufacture of a binary type diffractive optical element according to an embodiment of the present invention.

FIG. 4 is a flow chart of optical element manufacturing method, according to an embodiment of the present invention. FIG. 5 is a schematic view for explaining the procedure of manufacture of an optical element in this embodiment of the present invention, for manufacturing a binary type diffractive optical element of four-level (four-step) structure.

Denoted in FIG. 5 at 100 is a transparent glass substrate of a refractivity n, and denoted at 101 and 104 are resist materials. In this example, each of the resists 101 and 104 comprises a positive type resist. Denoted at 102 is a mask (first mask) to be used for a first exposure, and denoted at 105 is a mask (second mask) to be used for a second exposure. Denoted at 103 or 106 is exposure light.

First, in process A, a pattern of the first mask 102 is transferred to the resist 101 by use of the exposure light 103. In process B, development of the resist 101 is performed. In process C, etching of the glass substrate 100 is performed while the resist pattern defined by the development is used as a mask pattern. Then, in process D, unnecessary resist on the substrate 100 is removed, whereby a binary type optical element of two-level step structure is accomplished.

The etching depth $d_1$ in process C is determined, when the wavelength to be used with the binary type optical element is $\lambda$, by the following equation:

$$d_1 = \lambda/[2(n-1)]$$

Subsequently, to the glass substrate 100 on which a binary type optical element of two-level structure has been formed, a resist material (104) is applied again, and in process E the second mask 105 is used to perform a second exposure.

In this embodiment, the pattern of the mask 105 has a pitch a half of the pattern of the mask 102. In process E, the exposure is performed while correctly aligning the edge of a light blocking portion of the mask pattern with the edge of the two-level binary structure. In process F, development treatment is performed whereby a resist pattern as illustrated is formed.

Process E has been explained above with respect to an example wherein the pattern of the mask 105 and the pattern of the mask 102 are correctly aligned with each other. Practically, however, it is not easy to align the mask 105 with the mask 102, more exactly, to align the mask 105 with the substrate 100 on which a two-level step-like structure has been formed by use of the mask 102. In practice, there occurs a registration error (alignment error) between these masks.

In this embodiment, in consideration of the above, after completion of the exposure (process E) using the second mask 105 and the development (process F), measurement of alignment error is performed. Then, on the basis of the measured alignment error, an optimum etching amount is calculated, as will be described later, and, in accordance with the calculation, the etching is performed in subsequent process G.

Then, in process H, unnecessary resist is removed whereby a binary type diffractive optical element of four-level structure is accomplished.

Now, the manner of determining the etching amount in accordance with the amount of alignment error between the second mask 105 and the first mask 102, in process E, in the present embodiment will be explained.

Figure 3:
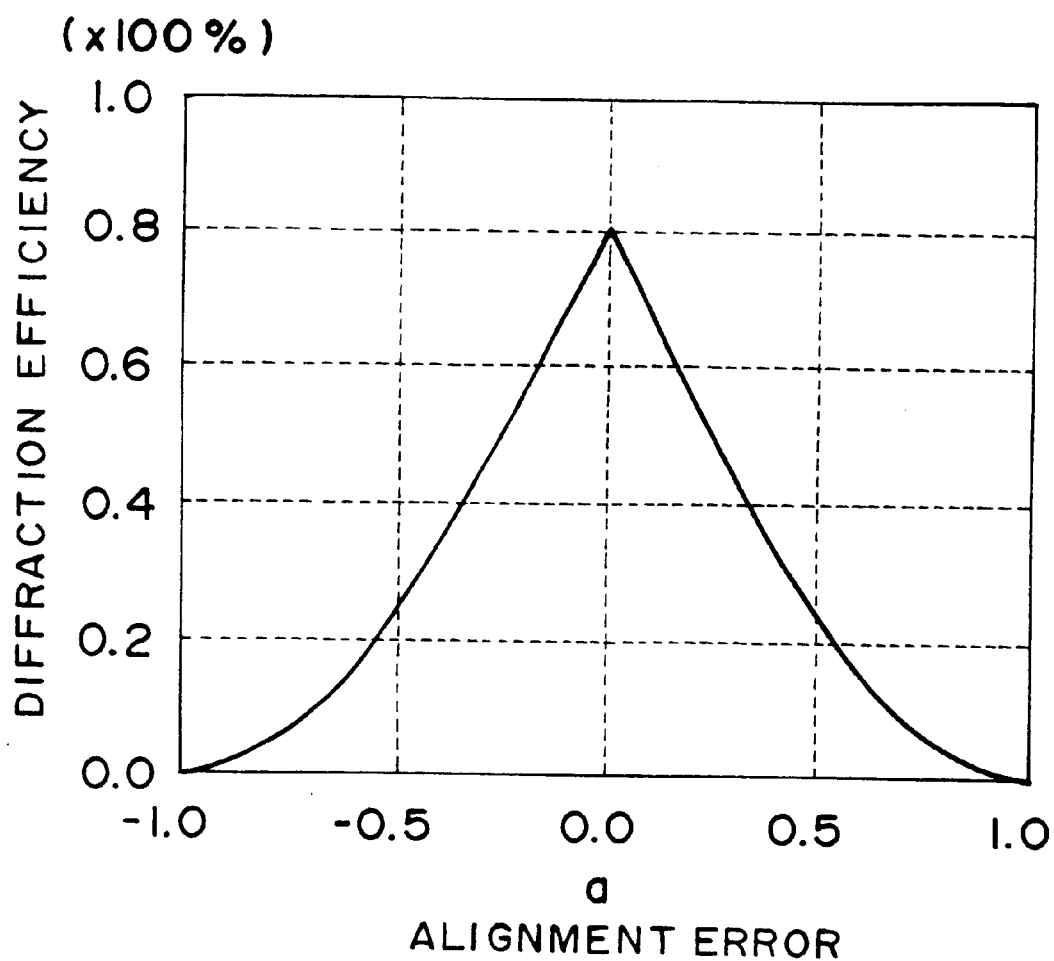
FIG. 3 is a graph for explaining the result of calculation on alignment error and diffraction efficiency.

The relation between the alignment error of the second mask 105 and the diffraction efficiency of first-order diffraction light is such as shown in FIG. 3. Here, calculation of diffraction efficiency is performed again, while taking into account the relation with the etching depth in the second etching process. According to the scalar theory, the diffraction efficiency of (m)th-order diffraction light from a structure which has a period T in X direction and which provides a phase distribution p(x) with respect to incident plane wave front, can be calculated by using a square of an absolute value of $$C_m = (1/T) \int_0^T \exp[i\{p(x) - 2\pi mx/T\}] dx \quad (2)$$

that is, by using $|C_m|^2$.

Figure 1A:
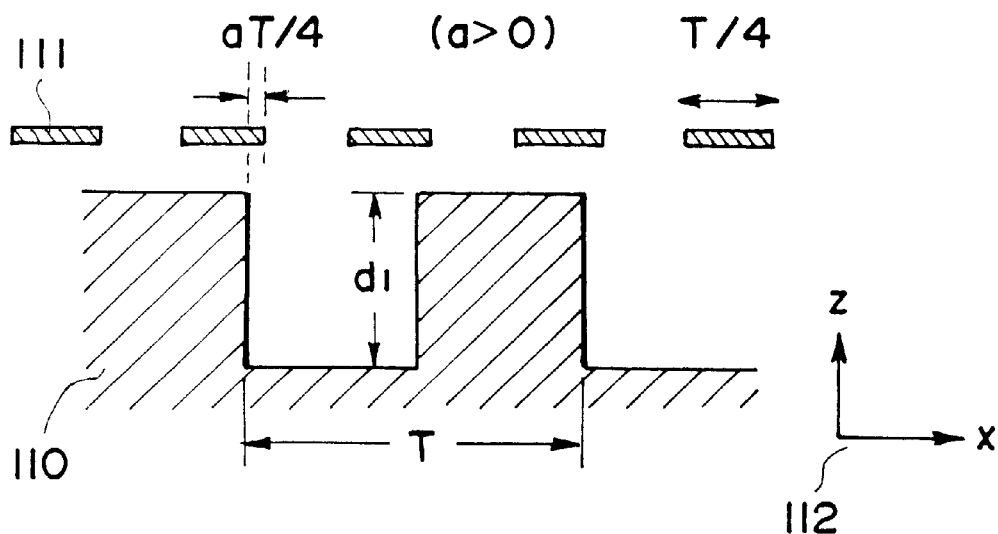
FIGS. 1A and 1B are schematic views, respectively, for explaining the relation between alignment error and the shape of optical element.
Figure 1B:
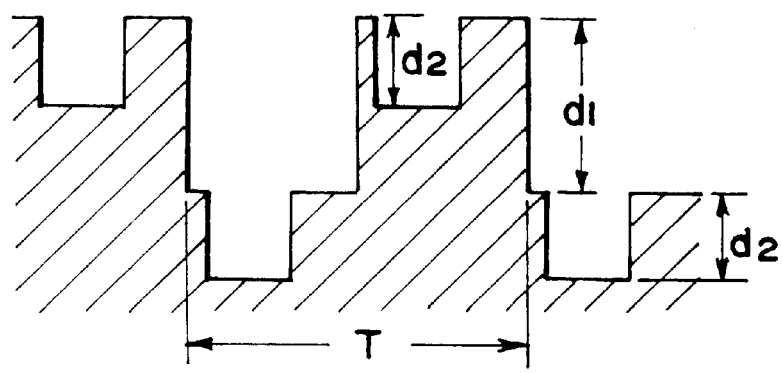

First, the shape shown in FIG. 1B where a>0 may be expressed in terms of a phase function. In this case, the depth $d_1$ of first time etching is kept at $d_1 = \lambda/[2(n-1)]$ that is, it is kept fixed at the phase difference $\pi$. However, the depth $d_2$ of the second time etching is set as $d_2 = [\lambda(1+b)]/[4(n-1)]$ and the phase difference is expressed as $(1+b)\pi/n$. This makes it possible to take into account the effect of the second time etching depth $d_2$ upon the diffraction efficiency, using b as a parameter.

It is seen from the above that the phase function p(x) may be determined as illustrated in FIG. 6. While the origin of phase may be set as desired, here, for convenience, it is set as shown in FIG. 6. Calculation may be made while taking the X-direction range from 0 to T as one period and, in regard to first-order diffraction light, from equation, the following equation may be derived.

$$C_1 = (1/T)\left[\exp(i \cdot 0)\int_0^{aT/4} \exp(-i2\pi x/T)dx + \right.$$
$$\exp\{-i\pi(1+b)/2\}\int_{aT/4}^{(1+a)T/4} \exp(-i2\pi x/T)dx +$$
$$\exp(i \cdot 0)\int_{(1+a)T/4}^{T/2} \exp(-i2\pi x/T)dx +$$
$$\exp(i\pi)\int_{T/2}^{(2+a)T/4} \exp(-i2\pi x/T)dx +$$
$$\exp\{i\pi(1-b)/2\}\int_{(2+a)T/4}^{(3+a)T/4} \exp(-i2\pi x/T)dx +$$
$$\left.\exp(i\pi)\int_{(3+a)T/4}^{T} \exp(-i2\pi x/T)dx\right]$$
$$= \ldots$$
$$= (1/i\pi)\{2 - (1+i)\exp\{-i\pi(a/2)\} +$$
$$(1-i)\exp[-i\pi\{(a+b)/2\}]$$

Thus, the diffraction efficiency of first-order diffraction light can be expressed as:

$$|C_1|^2 = (8/\pi^2) - (4/\pi^2)[\sin\{\pi(a/2)\} + \cos\{\pi(a/2)\} - \quad (3)$$
$$\sin\{\pi(b/2)\} + \sin\{\pi((a+b)/2)\} -$$
$$\cos\{\pi((a+b)/2)\}]$$

Figure 2A:
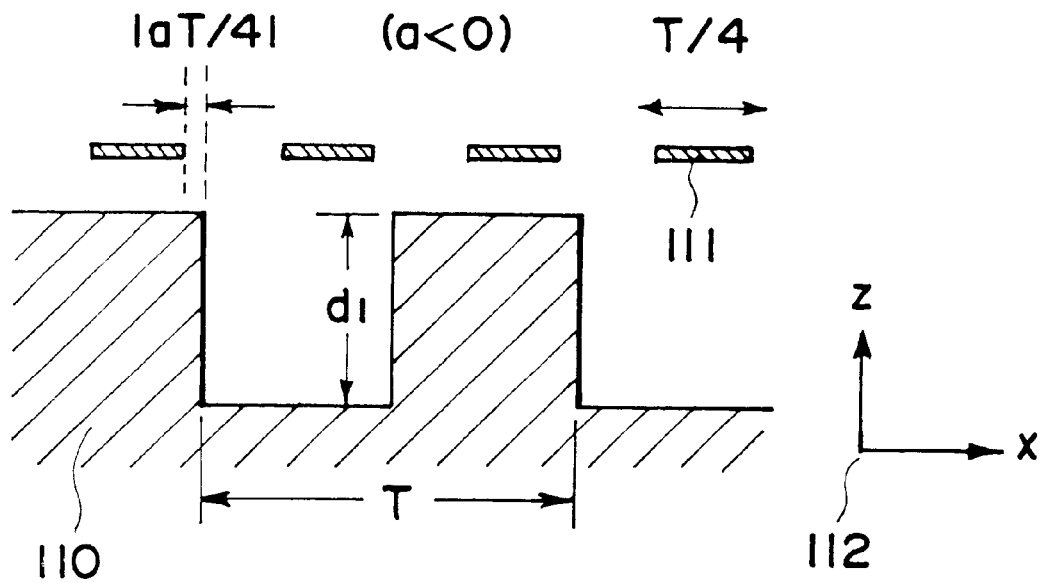
FIGS. 2A and 2B are schematic views, respectively, for explaining another example of the relation between alignment error and the shape of optical element.
Figure 2B:
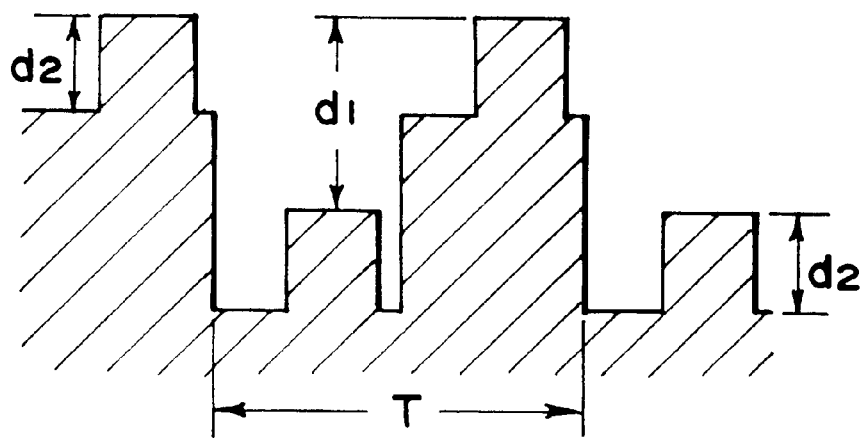

Subsequently, the shape shown in FIG. 2B where a<0 may be expressed similarly as above, in terms of a phase function, and a result such as shown in FIG. 7 may be provided. With regard to this phase distribution, diffraction efficiency of first-order diffraction light may be calculated, as follows: First, $$C_1 = (1/i\pi)[(1-i)\exp\{-i\pi(a/2)\} -$$
$$2i\exp\{-i\pi(b/2)\} + (1+i)\exp\{-i\pi((a+b)/2)\}]$$

is given, and it follows from this that $$|C_1|^2 = (8/\pi^2) - (4/\pi^2)[\sin\{-\pi(a/2)\} + \cos\{\pi(a/2)\} - \quad (4)$$
$$\sin\{\pi(b/2)\} + \sin\{\pi((-a+b)/2)\} -$$
$$\cos\{\pi((-a+b)/2)\}]$$

Comparing equations (3) and (4) with each other while taking note of the sign of "a", it is seen that they can be synthesized into $$|C_1|^2 = (8/\pi^2) - (4/\pi^2)[\sin\{\pi(|a|/2)\} + \cos\{\pi(|a|/2)\} - \quad (5)$$
$$\sin\{\pi(b/2)\} + \sin\{\pi((|a|+b)/2)\} -$$
$$\cos\{\pi((|a|+b)/2)\}]$$

This equation is totally symmetrical with respect to the positiveness/negativeness of the parameter "a". If b=0 in equation (5), it follows that $|C_1|^2 = (8/\pi^2)[1-\sin\{\pi(|a|/2)\}]$ This is exactly as described with reference to equation (1).

Figure 8:
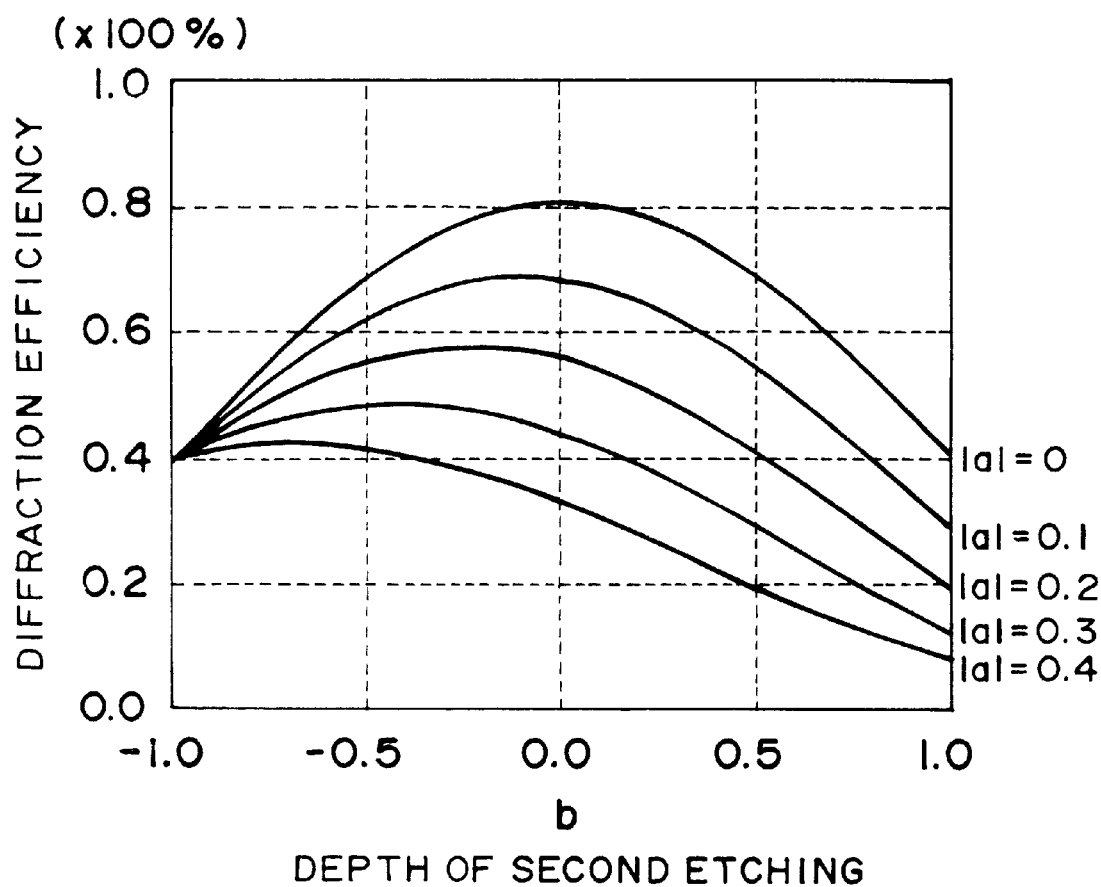
FIG. 8 is a graph for explaining the result of calculation on etching depth and diffraction efficiency.

FIG. 8 shows the result of calculation of diffraction efficiency of first-order diffraction light, while taking the parameter b, representing the second time etching depth $d_2$, on the axis of abscissa. The magnitude of |a| which represents the alignment error, changes in a range from 0 to 0.4.

It is seen from this graph that, in a case of zero alignment error (|a|=0), a maximum diffraction efficiency is attainable with b=0. In other words, the diffraction efficiency becomes highest when $$d_2 = \lambda/[4(n-1)]$$

is satisfied.

As compared therewith, if the alignment error is not zero (|a|≈0), the value of b with which the diffraction efficiency becomes largest shifts from the position b=0, in the direction of b<0. Also, it is seen that this position is changeable with the magnitude of the alignment error. Namely, assuming the presence of an alignment error of a certain magnitude, the etching depth with which a maximum diffraction efficiency is attainable can be determined fixedly.

More specifically, if for example there is an alignment error corresponding to |a|=0.1, a highest diffraction efficiency may be provided when the etching depth $d_2$ in the second etching process corresponds to b=−0.15, that is, the amount smaller by about 15% than the value as determined by $$d_2 = \lambda/[4(n-1)]$$

Thus, in this embodiment, the magnitude of alignment error is measured and, in accordance with it, the etching depth $d_2$ of the second etching is controlled. By this, the effect of alignment error on the diffraction efficiency can be reduced.

On the basis of this, the present invention enables manufacture of good diffractive optical elements.

Figure 9A:
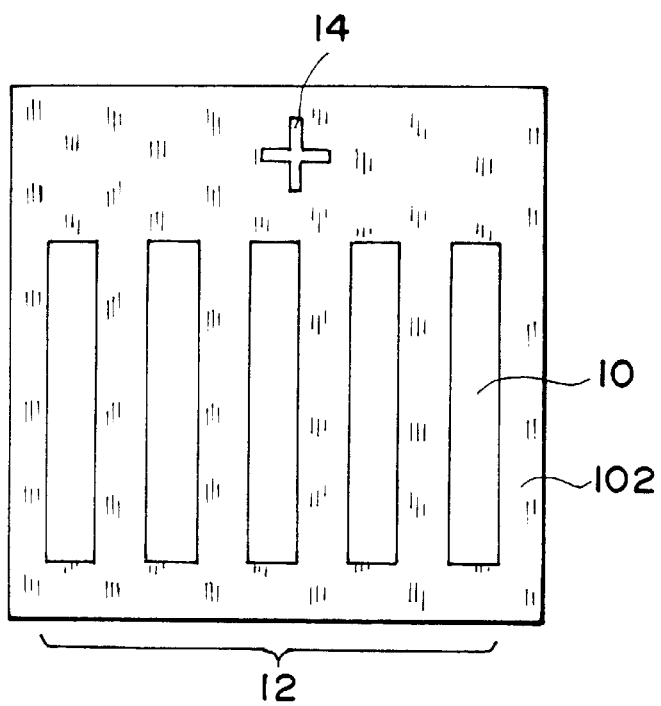
FIGS. 9A and 9B are schematic views, respectively, for explaining examples of mask pattern.
Figure 9B:
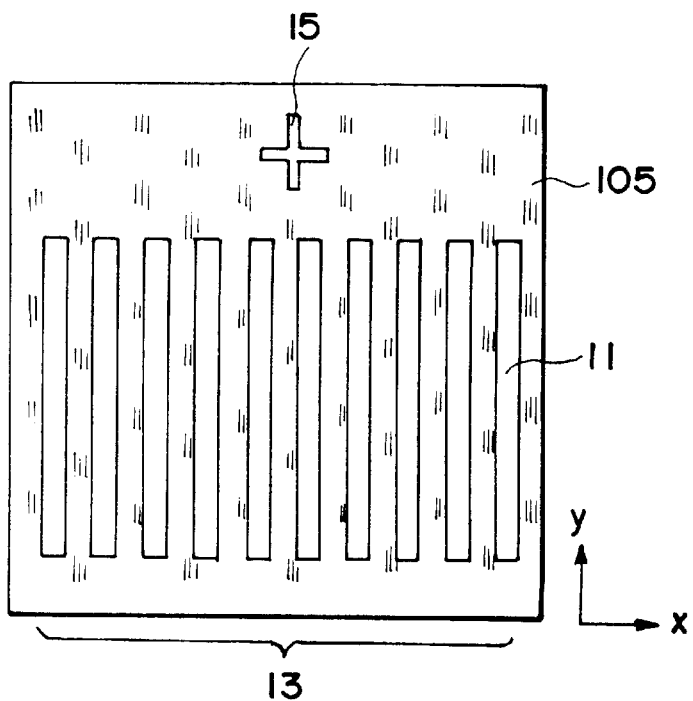

Next, the manner of measuring the alignment error will be described. FIGS. 9A and 9B are schematic views of a first mask 102 and a second mask 105, respectively. If a positive type resist is used, images of openings 10 and 11 will be transferred to a glass substrate. These masks are formed with pattern groups 12 and 13 to be used for forming a binary type diffractive optical element. Additionally, there are alignment error measurement marks 14 and 15, formed on the first and second masks 102 and 105, respectively.

The pattern group 12, the alignment error measurement mark 14, the pattern group 13, and the alignment error measurement mark 15 are disposed in a predetermined positional relationship, such that, only when the pattern groups 12 and 13 are registered idealistically with each other upon the glass substrate, the images of the two alignment error measurement marks 14 and 15 are placed exactly at the same position.

Figure 10:
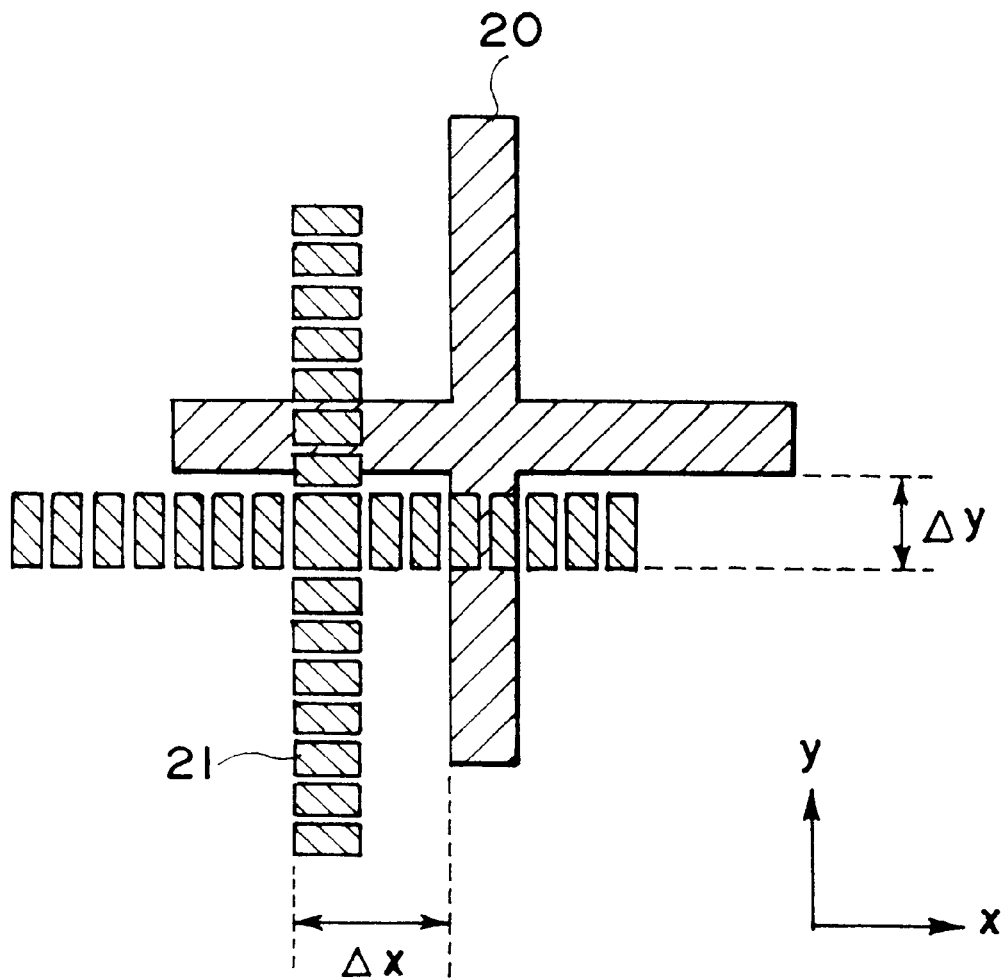
FIG. 10 is a schematic view for explaining positional relationship between images of two alignment error measurement marks.

FIG. 10 shows an example of positional relation between an image 20 of the alignment error measurement mark 14 and an image 21 of the alignment error measurement mark 15, after completion of second exposure (process F).

The two masks 102 and 105 shown in FIGS. 9A and 9B are equipped with alignment marks (not shown), and the positional relation between these masks is controlled by using these alignment marks. Practically, however, due to various factors, pattern transfer is performed with misalignment. FIG. 10 shows an example with such misalignment.

Here, by measuring the positional relation between the images 20 and 21 of the two alignment error measurement marks 14 and 15, the positional relation between the images of the pattern groups 12 and 13 can be detected. The deviation between the images 20 and 21 may be resolved into x-component and y-component. Of these components, x-component (Δx) corresponds to the alignment error which adversely affects the diffraction efficiency, in this example.

In this embodiment, to a measured alignment error Δx, an optimum etching depth $d_2$ in the second etching process (process G) is calculated in accordance with equation (5), and the second etching process is performed on the basis of this information. By this, the effect of alignment error on the decrease of diffraction efficiency can be minimized.

While the embodiment has been described with reference to an example where four-level binary structure is manufactured by use of two masks, the procedure is similarly applicable to manufacture of binary type diffractive optical element with more levels (steps).

Also, while the foregoing description has been made to an example of binary type diffractive optical element wherein patterns of the same period are repeated one-dimensionally, the present invention is similarly applicable to a binary diffractive optical element of the type having a two-dimensional period distribution and, additionally, having non-uniform period, such as a Fresnel lens, for example. In that case, as regards the alignment error for calculation of etching depth, not only, Δx in FIG. 10 but also Δy may be used.

Next, an embodiment of illumination system and projection exposure apparatus for manufacture of semiconductor devices, in which a binary diffractive optical element having been manufactured in accordance with the present invention is incorporated as a lens element of light collecting or diverging system, will be explained.

FIGS. 11A and 11B are schematic views of a main portion of an illumination system having a diffractive optical element, according to an embodiment of the present invention. FIG. 11A is taken on a first plane, i.e., X-Z plane. FIG. 11B is taken on a second plane, i.e., Y-Z plane.

Denoted in the drawings at 1 is a light source such as a Hg lamp or excimer laser, for example. Denoted at 2 is a beam shaping optical system including a beam compressor, for example. It serves to adjust the light from the light source 1 into a desired beam shape, and to project the same on the light entrance surface 5a of an optical integrator 5 which serves as a homogenizer. As will be described later, the optical integrator 5 has two diffractive optical elements, that is, first and second diffractive optical elements having different refractive powers with respect to both of X-Z sectional plane (FIG. 11A) and Y-Z sectional plane (FIG. 11B). A plurality of secondary light sources are defined at the light exit surface 5b thereof. Denoted at 3 is a condenser lens for collecting light beams from the secondary light sources, at the light exit surface of the optical integrator 5, so that they are superposed one upon another on the surface 4 to be illuminated.

In the illumination system according to this embodiment, the light emitted by the light source 1 is transformed by the beam shaping optical system 2 into a desired beam diameter, and then it is projected on the light entrance surface 5a of the optical integrator 5. In response, a plurality of secondary light sources are defined at the light exit surface 5b. The lights from these secondary light sources at the light exit surface 5b are then projected by the condenser lens 3 to Koehler-illuminate the surface 4 to be illuminated. Here, the optical integrator 5 is arranged to have a numerical aperture θx with respect to X-direction sectional plane of FIG. 11A and a numerical aperture θy with respect to Y-direction sectional plane of FIG. 11B, which are different from each other, such that the illumination regions along these sectional planes have different widths Dx and Dy.

FIGS. 12A and 12C and FIGS. 12B and 12D are schematic views of a main portion of the optical integrator 5, shown in FIGS. 11A and 11B. FIGS. 12A and 12C are taken on the X-Z plane, while FIGS. 12B and 12D are taken on the Y-Z plane.

As shown in FIGS. 12A and 12C and FIGS. 12B and 12D, the optical integrator 5 comprises a number of small diffractive optical elements 21, shown in detail in FIG. 12C, with focal length $f_{ix}$, having a power in the X-direction sectional plane as viewed in the drawing and being arrayed at the front side (light source 1 side) of the same substrate 20. Also, the optical integrator further comprises a number of small diffractive optical elements 22, shown in detail in FIG. 12D, with focal length $f_{iy}$, having a power in the Y-direction sectional plane as viewed in the drawing and being arrayed at the back side of the substrate. The combinations of these small diffractive optical elements 21 and 22 provide a first diffractive optical element and a second diffractive optical element, respectively. As regards the focal lengths $f_{ix}$ and $f_{iy}$, they are in a relation $f_{ix} > f_{iy}$ and both of them have a positive value.

As shown in FIGS. 12A and 12C and FIGS. 12B and 12D, the refractive powers of the first and second diffractive optical elements 21 and 22 as well as the thickness of the substrate 20 and the refractivity of the material thereof, for example, are selected and adjusted so that the focal point position of the light passing through the first and second diffractive optical elements 21 and 22 is in exact registration, with respect to the first and second planes. With this arrangement, an illumination region of predetermined shape can be defined efficiently.

Small diffractive optical element of this embodiment can be manufactured by use of optical lithography technique as described. Thus, an element lens smaller than an element lens as attainable with conventional polishing process, for example, can be manufactured easily. This makes it possible to increase the number of element lenses considerably and consequently to increase the number of secondary light sources considerably. Thus, illumination of higher uniformity can be realized.

Figure 13:
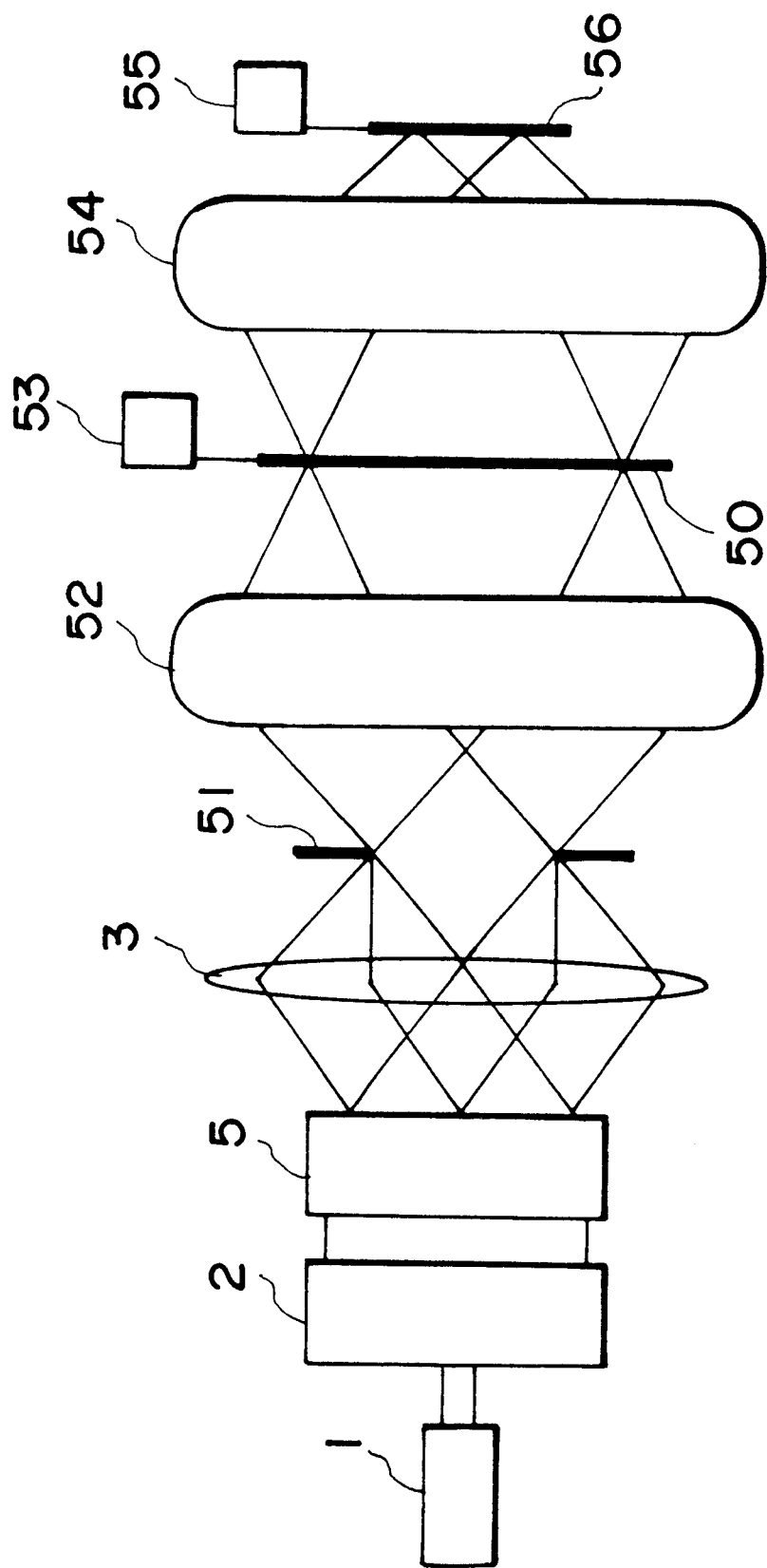
FIG. 13 is a schematic view of a main portion of a projection exposure apparatus into which an optical element manufactured in accordance with an embodiment of the present invention is incorporated.

FIG. 13 is a schematic view of a main portion of a projection exposure apparatus having a diffractive optical element, according to an embodiment of the present invention. Denoted in the drawing at 1 is a light source, and denoted at 2 is a beam shaping optical system. Denoted at 5 is an optical integrator, and denoted at 3 is a condenser lens. These components are similar to those used in the illumination system of FIGS. 11A and 11B.

Denoted at 51 is a stop, which corresponds to the position of the surface 4 to be illuminated (FIGS. 11A or 11B). Denoted at 51 is a stop imaging lens for projecting an image of the aperture shape of the stop 51 on to a reticle 50 which is disposed on the surface to be illuminated. The illumination region on the reticle 50 surface has a shape analogous to the aperture shape of the stop 51. Denoted at 54 is a projection lens (projection optical system) for projecting a pattern on the reticle 50 surface on to the surface of a photosensitive substrate (wafer) 56. Denoted at 53 is driving means for moving the reticle 50, and denoted at 55 is driving means for moving the wafer 56.

In this embodiment, a circuit pattern of the reticle 50 is printed, by projection through the projection lens 54, on the wafer 56 being coated with a photosensitive material such as a resist, in step-and-scan procedure. In an exposure apparatus of step-and-scan method, the pattern of the reticle 50 is not illuminated at once. Rather, the illumination area is defined in a slit-like shape, for example. Thus, a pattern of the reticle 50 placed within such illumination area is projected and transferred by the projection lens 54 to the exposure area on the wafer 56.

The reticle 56 is placed on a reticle stage, and it can be scanningly moved in X direction, for example, by the driving means 53. The wafer 56 is placed on a movable stage which can be scanningly moved by the driving means 55, along the X-axis direction and in an opposite direction to the reticle 50 movement. More specifically, the reticle 50 and the wafer 56 are scanningly moved in opposite directions, in synchronism with each other, at a speed ratio corresponding to the projection magnification of the projection lens 54.

While in this embodiment a diffractive optical element is used in an illumination system, a diffractive optical element of ring-like shape manufactured in accordance with the present invention may be used in a projection optical system.

Next, an embodiment of device manufacturing method which uses a projection exposure apparatus such as described above, will be explained.

Figure 14:
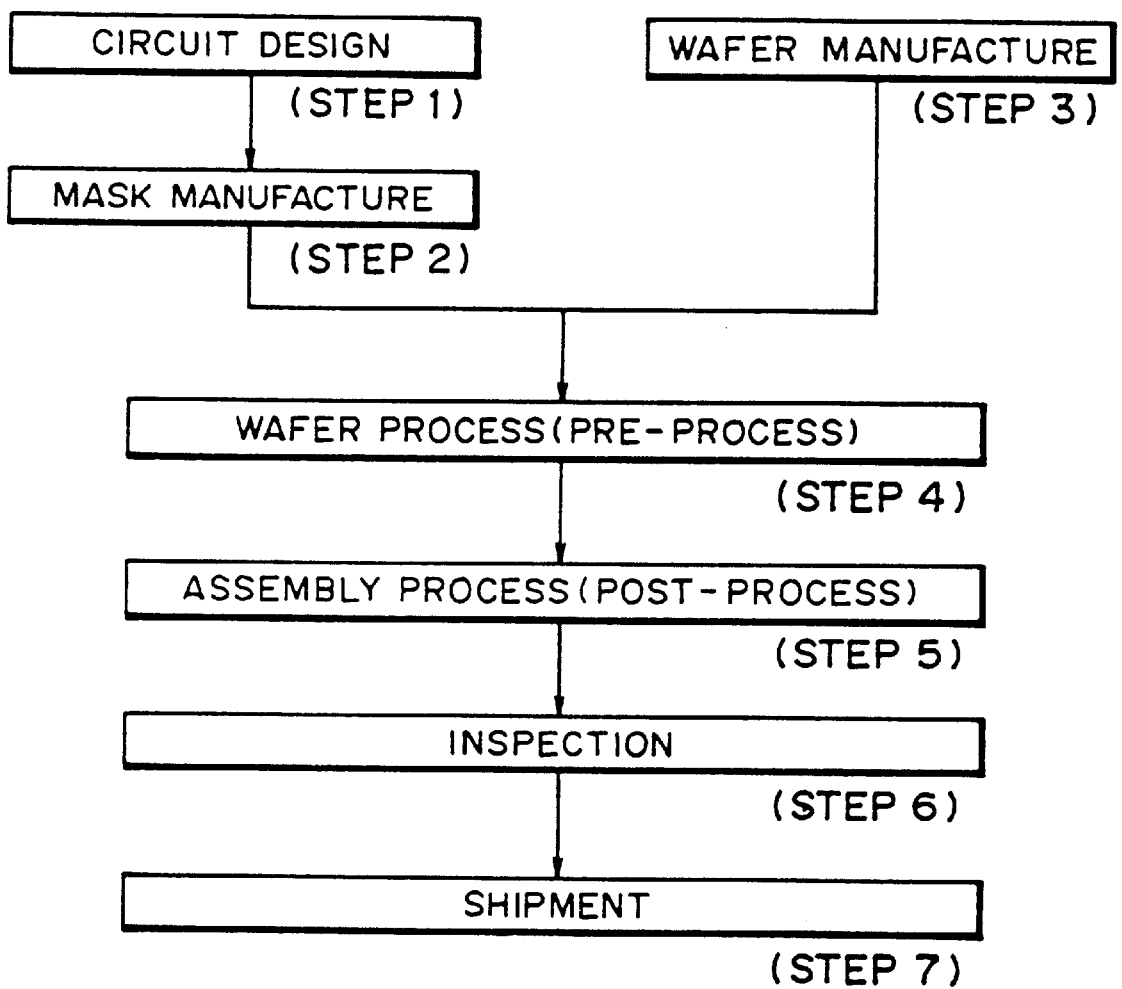
FIG. 14 is a flow chart for explaining device manufacturing processes.

FIG. 14 is a flow chart of procedure for manufacture of microdevices such as semiconductor chips (e.g. ICs or LSIs), liquid crystal panels, or CCDs, for example.

Step 1 is a design process for designing a circuit of a semiconductor device. Step 2 is a process for making a mask on the basis of the circuit pattern design. Step 3 is a process for preparing a wafer by using a material such as silicon. Step 4 is a wafer process which is called a pre-process wherein, by using the so prepared mask and wafer, circuits are practically formed on the wafer through lithography.

Step 5 subsequent to this is an assembling step which is called a post-process wherein the wafer having been processed by step 4 is formed into semiconductor chips. This step includes assembling (dicing and bonding) process and packaging (chip sealing) process. Step 6 is an inspection step wherein operation check, durability check and so on for the semiconductor devices provided by step 5, are carried out. With these processes, semiconductor devices are completed and they are shipped (step 7).

Figure 15:
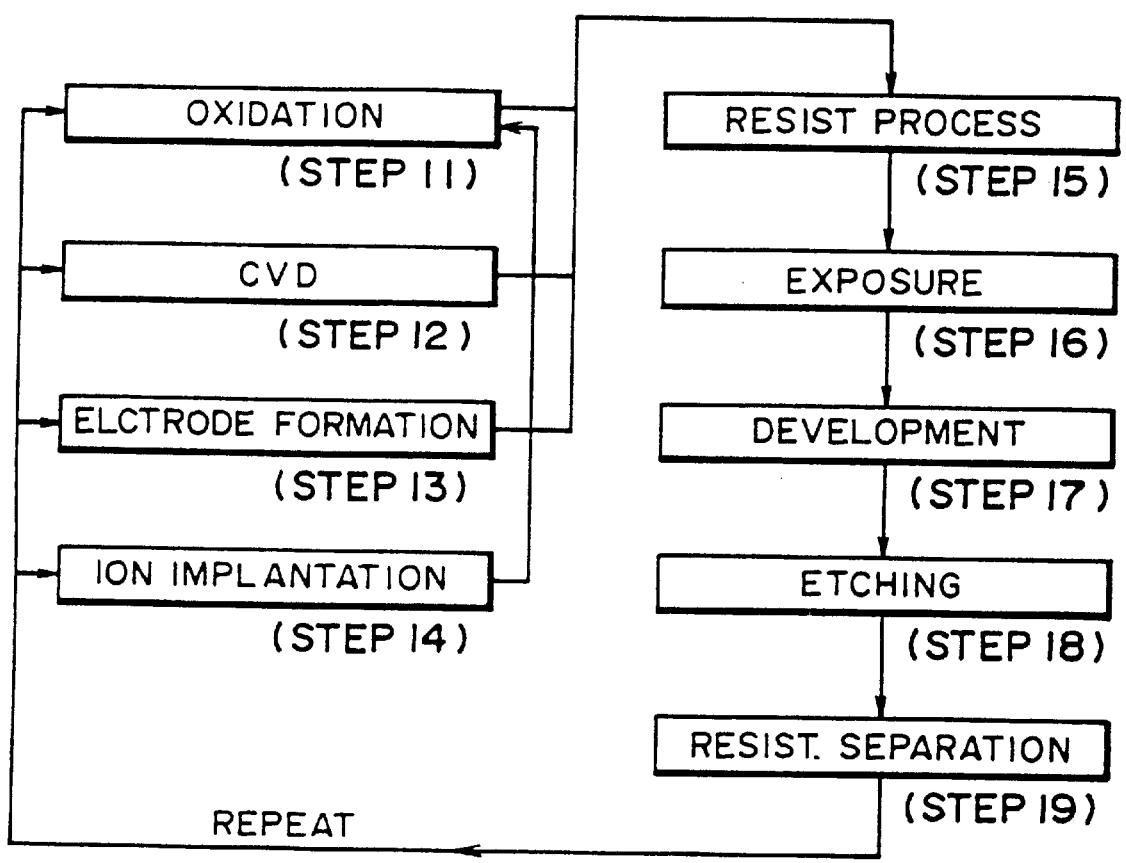
FIG. 15 is a flow chart for explaining details of a wafer process in the procedure of FIG. 14.

FIG. 15 is a flow chart showing details of the wafer process. Step 11 is an oxidation process for oxidizing the surface of a wafer. Step 12 is a CVD process for forming an insulating film on the wafer surface.

Step 13 is an electrode forming process for forming electrodes upon the wafer by vapor deposition. Step 14 is an ion implanting process for implanting ions to the wafer. Step 15 is a resist process for applying a resist (photosensitive material) to the wafer. Step 16 is an exposure process for printing, by exposure, the circuit pattern of the mask on the wafer through the exposure apparatus described above. Step 17 is a developing process for developing the exposed wafer. Step 18 is an etching process for removing portions other than the developed resist image. Step 19 is a resist separation process for separating the resist material remaining on the wafer after being subjected to the etching process. By repeating these processes, circuit patterns are superposedly formed on the wafer.

With these processes, high density microdevices can be manufactured easily.

Next, an embodiment of manufacturing system with which a manufacturing method of the present invention can be embodied, will be explained with reference to FIG. 16.

Figure 16:
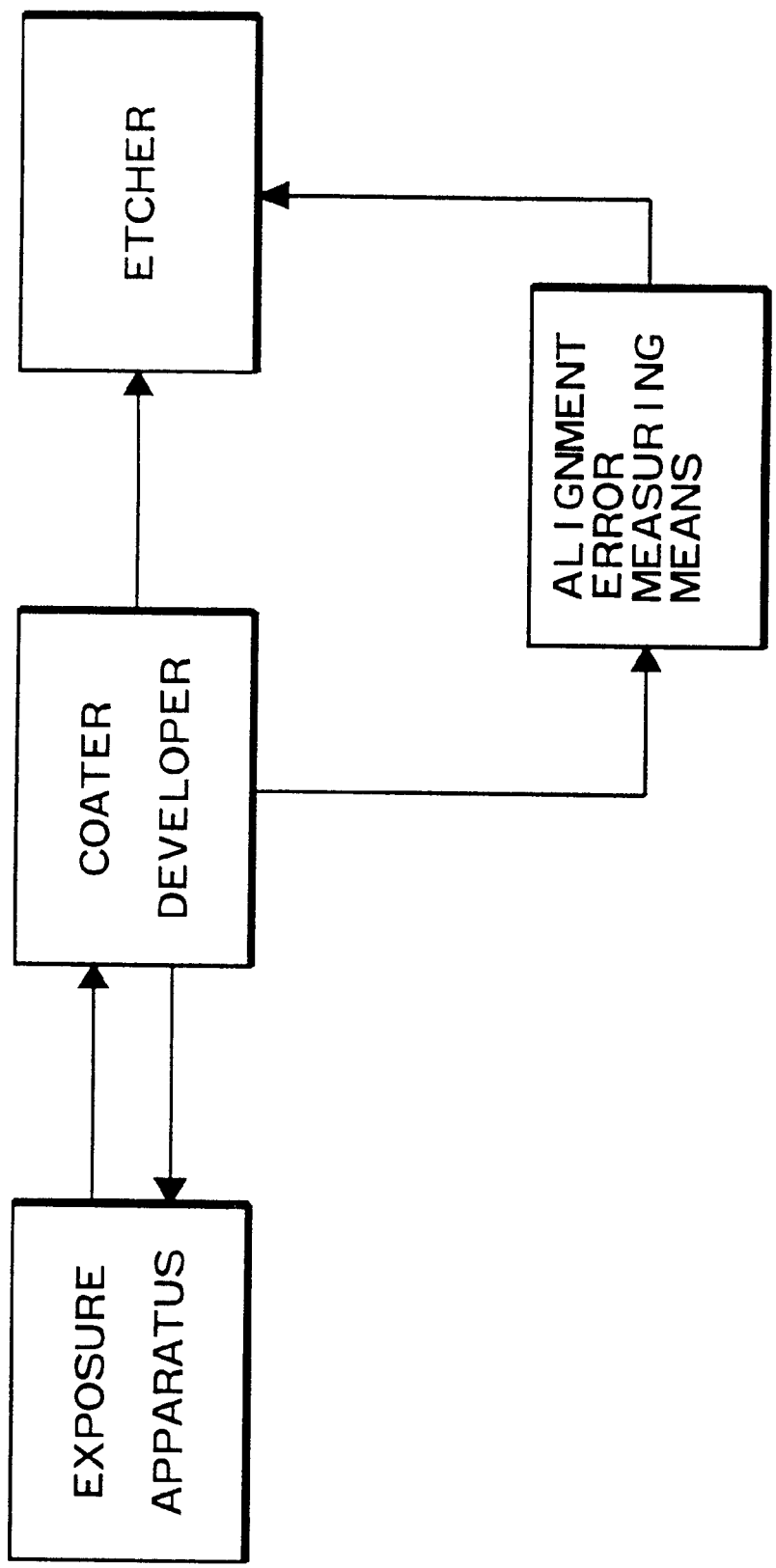
FIG. 16 is a schematic view of a manufacturing system based on a manufacturing method according to an embodiment of the present invention.

In FIG. 16, denoted at 201 is an exposure apparatus for performing an exposure process. Denoted at 202 is a coater and developer, for performing resist coating and resist development after exposure. Denoted at 203 is an etcher for performing the etching process while using a developed resist pattern as a mask pattern. Denoted at 204 is alignment error measuring means for measuring, after second time resist pattern development, alignment error between a mask having been used previously and a mask just to be used or just having been used. The optical element manufacturing method such as described with reference to FIGS. 4 or 5, for example, can be embodied in this manufacturing system, for example.

While the invention has been described with reference to the structures disclosed herein, it is not confined to the details set forth and this application is intended to cover such modifications or changes as may come within the purposes of the improvements or the scope of the following claims.

What is claimed is:

1. An optical element manufacturing system, comprising:

means for forming a mask pattern on a substrate;

means for determining a relative alignment error between a mask pattern just having been formed and a mask pattern previously formed; and means for forming a step-like structure on the substrate by use of the mask pattern just having been formed, wherein the height of the step-like structure to be formed through said step-like structure forming means is determined in accordance with the determined alignment error determined by said determining means.

2. An illumination system, comprising:

a light directing device configured to direct illumination light supplied from a light source to an object to be illuminated, said light directing device including an optical element, said optical element having been manufactured through a procedure which includes a first process for forming a mask pattern on a substrate, and a second process for forming a step-like structure on the substrate by use of the mask pattern, wherein the first and second processes are repeated N times, and wherein, before execution of the (k)th time second process where $2 \leq k \leq N$, the relative alignment error between a mask pattern as formed through the (k)th time first process and a mask pattern as formed through the (k−1)th time first process is detected, and wherein the height of the step-like structure to be defined by the (k)th time second process is determined in accordance with the detected alignment error, wherein said optical element has a step-like structure having a detected-alignment-error-determined height.

3. An illumination system, comprising:

a light directing device configured to direct illumination light supplied from a light source to an object to be illuminated, said light directing device including an optical element, said optical element having been manufactured through a procedure which includes a first process for forming a first mask pattern on a substrate, a second process for forming a step-like structure on the substrate by use of the first mask pattern, a third process for forming a second mask pattern on the substrate, a fourth process for detecting a relative alignment error between the first and second mask patterns, and a fifth process for forming a step-like structure on the substrate by use of the second mask pattern, wherein the height of the step-like structure to be formed through the fifth process is determined in accordance with the detected alignment error detected by the fourth process, wherein said optical element has a step-like structure having a detected-alignment-error-determined height.

4. An illumination system comprising:

a light directing device configured to direct illumination light supplied from a light source to an object to be illuminated, said light directing device including an optical element, said optical element having been manufactured through a procedure which includes a first process for forming a mask pattern on a substrate, a second process for detecting a relative alignment error between a mask pattern just having been formed and a mask pattern previously formed, and a third process for forming a step-like structure on the substrate by use of the mask pattern just having been formed, wherein the height of the step-like structure to be formed through the third process is determined in accordance with the detected alignment error, wherein said optical element has a step-like structure having a detected-alignment-error-determined height.

5. An exposure apparatus, comprising:

illumination means for directing illumination light supplied from a light source to a reticle; and projection means for projecting an image of the reticle on to a wafer;

wherein at least one of said illumination means and said projection means includes an optical element, said optical element having been manufactured through a procedure which includes a first process for forming a mask pattern on a substrate, and a second process for forming a step-like structure on the substrate by use of the mask pattern, wherein the first and second processes are repeated N times, and wherein, before execution of the (k)th time second process where $2 \leq k \leq N$, a relative alignment error between a mask pattern as formed through the (k)th time first process and a mask pattern as formed through the (k−1)th time first process is detected, and wherein the height of the step-like structure to be defined by the (k)th time second process is determined in accordance with the detected alignment error, wherein said optical element has a step-like structure having a detected-alignment-error-determined height.

6. An exposure apparatus, comprising:

illumination means for directing illumination light supplied from a light source to a reticle; and projection means for projecting an image of the reticle on to a wafer;

wherein at least one of said illumination means and said projection means includes an optical element, said optical element having been manufactured through a procedure which includes a first process for forming a first mask pattern on a substrate, a second process for forming a step-like structure on the substrate by use of the first mask pattern, a third process for forming a second mask pattern on the substrate, a fourth process for detecting a relative alignment error between the first and second mask patterns, and a fifth process for forming a step-like structure on the substrate by use of the second mask pattern, wherein the height of the step-like structure to be formed through the fifth process is determined in accordance with the detected alignment error, wherein said optical element has a step-like structure having a detected-alignment-error-determined height.

7. An exposure apparatus, comprising:

illumination means for directing illumination light supplied from a light source to a reticle; and projection means for projecting an image of the reticle on to a wafer;

wherein at least one of said illumination means and said projection means includes an optical element, said optical element having been manufactured through a procedure which includes a first process for forming a mask pattern on a substrate, a second process for detecting a relative alignment error between a mask pattern just having been formed and a mask pattern previously formed, and a third process for forming a step-like structure on the substrate by use of the mask pattern just having been formed, wherein the height of the step-like structure to be formed through the third process is determined in accordance with the detected alignment error, wherein said optical element has a step-like structure having a detected-alignment-error-determined height.

* * * * *

UNITED STATES PATENT AND TRADEMARK OFFICE
CERTIFICATE OF CORRECTION

PATENT NO.     : 6,301,001 B1
DATED          : October 9, 2001
INVENTOR(S)    : Yasuyuki Unno It is certified that error appears in the above-identified patent and that said Letters Patent is hereby corrected as shown below:

<u>Column 4,</u>
Line 22, "views," should read -- views --.

Signed and Sealed this

Ninth Day of July, 2002

*Attest:*

JAMES E. ROGAN
*Attesting Officer*  *Director of the United States Patent and Trademark Office*